(12) United States Patent
Shin et al.

(10) Patent No.: US 8,687,443 B2
(45) Date of Patent: Apr. 1, 2014

(54) SEMICONDUCTOR APPARATUS

(75) Inventors: Sang Hoon Shin, Ichon-shi (KR); Kang Seol Lee, Ichon-shi (KR)

(73) Assignee: SK Hynix Inc., Gyeonggi-do ( * ) Notice: Subject to any disclaimer, the term of this patent is extended or adjusted under 35 U.S.C. 154(b) by 295 days.

(21) Appl. No.: 13/171,747

(22) Filed: Jun. 29, 2011

(65) Prior Publication Data

US 2012/0243355 A1    Sep. 27, 2012

(30) Foreign Application Priority Data

Mar. 24, 2011    (KR) .................. 10-2011-0026371

(51) Int. Cl.
*G11C 7/00*    (2006.01)
*G11C 29/00*    (2006.01)

(52) U.S. Cl.
USPC ............... 365/200; 365/230.06; 365/230.08; 365/201; 365/51

(58) Field of Classification Search
USPC ............... 365/200, 230.06, 230.08, 201, 51; 257/777, E27.11
See application file for complete search history.

(56) References Cited

U.S. PATENT DOCUMENTS

| | | | | |
|---|---|---|---|---|
| 8,243,486 | B2* | 8/2012 | Riho | 365/51 |
| 2009/0103345 | A1* | 4/2009 | McLaren et al. | 365/64 |
| 2011/0079923 | A1* | 4/2011 | Suh | 257/777 |
| 2011/0084404 | A1* | 4/2011 | Yoko et al. | 257/777 |
| 2011/0084758 | A1* | 4/2011 | Shibata et al. | 327/565 |
| 2011/0184688 | A1* | 7/2011 | Uetake et al. | 702/120 |
| 2012/0146207 | A1* | 6/2012 | Chou et al. | 257/690 |
| 2012/0195136 | A1* | 8/2012 | Yoko | 365/189.07 |

FOREIGN PATENT DOCUMENTS

| | | |
|---|---|---|
| KR | 1020100018937 A | 2/2010 |
| KR | 1020100095515 A | 8/2010 |

\* cited by examiner

*Primary Examiner* — Toan Le
(74) *Attorney, Agent, or Firm* — William Park & Associates Patent Ltd.

(57) ABSTRACT

Various embodiments of a semiconductor apparatus are disclosed. In one exemplary embodiment, a semiconductor apparatus may include a memory block chip and a signal input/output chip. The memory block chip is configured to control a data access size according to specifications. The signal input/output chip is configured to transmit input data from an external device to the memory block chip or transmit output data from the memory block chip to an external device and process the input data or the output data by selectively enabling a clock phase control unit and a signal processing unit according to the specifications.

33 Claims, 7 Drawing Sheets

SEMICONDUCTOR APPARATUS

CROSS-REFERENCE TO RELATED APPLICATION

The present application claims priority under 35 U.S.C. §119(a) to Korean Patent Application No. 10-2011-0026371, filed on Mar. 24, 2011, in the Korean Intellectual Property Office, which is incorporated herein by reference in its entirety as if set forth in full.

BACKGROUND

1. Technical Field

Various embodiments of the present disclosure relate to a semiconductor apparatus. In particular, certain embodiments relate to a technology for stacking a plurality of semiconductor chips.

2. Related Art

Semiconductor memory apparatuses may be classified into dynamic random access memory (DRAM) apparatuses, synchronous dynamic random access memory (SDRAM) apparatuses, double data rate (DDR) SDRAM apparatuses, computing RAM apparatuses, graphics RAM apparatuses, and mobile RAM apparatuses, according to their purposes, intended uses, and specifications. Such various semiconductor memory apparatuses are developed independently of one another, and the semiconductor memory apparatuses are fabricated on a wafer-by-wafer basis.

In order to increase the storage capacity of a semiconductor memory apparatus, a plurality of semiconductor chips can be stacked two-dimensionally or three-dimensionally into a package. If each of the stacked semiconductor chips can be divided into a memory block and a peripheral circuit block, the area efficiency can be improved by stacking two or more semiconductor chips having only a memory block and a semiconductor chip having only a common peripheral circuit block. However, this is merely dividing the memory block and the peripheral circuit block after developing them at the same time. If the purposes, intended uses, and/or specifications are changed, a memory block and a peripheral block must be re-developed at the to same time.

SUMMARY

Accordingly, there is a need for an improved test mode control circuit that may obviate one or more problems mentioned above. In particular, various aspects of the present disclosure may provide a semiconductor apparatus having a stack of semiconductor chips, which can control internal settings selectively according to their uses and specifications. Some additional aspects may also provide a semiconductor apparatus having a stack of a memory block chip, a signal input/output chip, a main control chip, and a voltage generating chip that are fabricated separately.

To attain the advantages and in accordance with the purposes of the invention, as embodied and broadly described herein, one exemplary aspect of the present invention may provide a semiconductor apparatus, comprising: a memory block chip configured to control a data access size according to specifications; and a signal input/output chip configured to transmit input data from an external device to the memory block chip or transmit output data from the memory block chip to an external device and process the input data or the output data by selectively enabling a clock phase control unit and a signal processing unit according to the specifications.

In another exemplary aspect, a semiconductor apparatus may include: a memory block chip configured to control a data access size according to specifications; and a main control chip configured to decode an address and a command and selectively enable a register for setting a function corresponding to each of the specifications, wherein the memory block chip is configured to control a data access under the control of the main control chip.

In still another exemplary aspect of the present invention, a semiconductor apparatus may include: a memory block chip configured to control a data access size according to specifications; and a voltage generating chip configured to generate a plurality of internal voltages by a power supply voltage, provide the generated internal voltages to the memory block chip, and control a voltage level of the internal voltages according to the specifications.

According to some exemplary aspects, a semiconductor apparatus, which includes a plurality of through-chip vias piercing between a plurality of stacked chips and transmits signals and voltages between the stacked chips through the through-chip vias or a plurality of transmission lines, may include: a memory block chip configured to control a data access size according to specifications; a signal input/output chip configured to transmit input data from an external device to the memory block chip or transmit output data from the memory block chip to an external device and process the input data or the output data by selectively enabling a clock phase control unit and a signal processing unit according to the specifications; a main control chip configured to decode an address and a command and selectively enable a register for setting a function corresponding to each of the specifications; and a voltage generating chip configured to generate a plurality of internal voltages by a power supply voltage, provide the generated internal voltages to the stacked chips, and control a voltage level of the internal voltages according to the specifications, wherein the main control chip controls the memory block chip, the signal input/output chip, and the voltage generating chip.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Hereinafter, reference will now be made in detail to the exemplary embodiments of a semiconductor apparatus, examples of which will be described below with reference to the accompanying drawings. Wherever possible, the same reference characters will be used throughout the drawings to refer to the same or like parts.

Figure 1:
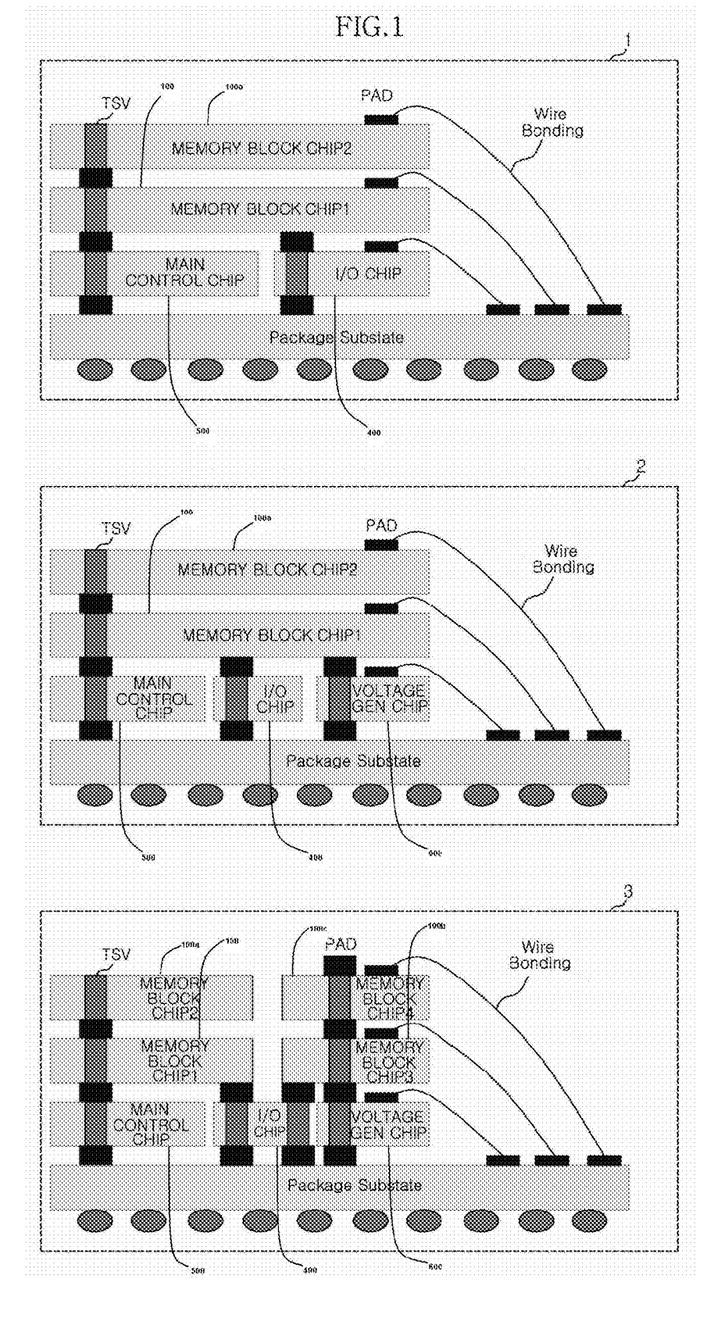
FIG. 1 is a schematic diagram illustrating various stack structures of a semiconductor apparatus according to some exemplary embodiments consistent with the present invention.

FIG. 1 illustrates three exemplary stack structures of a semiconductor apparatus having a plurality of vertically-stacked chips. The semiconductor apparatus consistent with the exemplary embodiments transmits signals and voltages between the chips through a plurality of through-chip vias (e.g., through-silicon vias (TSVs)) and a plurality of transmission lines. Although not depicted in FIG. 1, the transmission lines may be formed using a re-distribution layer (RDL). The RDL may be defined as an interconnection layer formed between the chips.

A method for stacking a plurality of chips to construct a semiconductor apparatus may use a through-chip via to transmit a common signal to a plurality of chips. If a semiconductor chip is fabricated using a silicon wafer, the through-chip via can be called a through-silicon via (TSV).

According to a first disclosed exemplary embodiment 1, the semiconductor apparatus may include a plurality of stacked chips comprising a first memory block chip 100, a second memory block chip 100*a*, a signal input/output chip 400, and a main control chip 500.

In this disclosed embodiment, the main control chip 500 is configured to transmit a control signal through a through-chip via (TSV) to control an operation of the first memory block chip 100 and an operation of the second memory block chip 100*a*. The signal input/output chip 400 is configured to exchange data with the first memory block chip 100 and the second memory block chip 100*a* through the through-chip via (TSV). Each of the chips includes a pad (PAD), and may exchange signals with an external device through a wire connected to the pad (PAD).

In the second disclosed exemplary embodiment 2, the semiconductor apparatus may include a plurality of stacked chips comprising a first memory block chip 100, a second memory block chip 100*a*, a voltage generating chip 600, a signal input/output chip 400, and a main control chip 500.

In this disclosed embodiment, the main control chip 500 is configured to transmit a control signal through a through-chip via (TSV) to control an operation of the first memory block chip 100 and an operation of the second memory block chip 100*a*. The signal input/output chip 400 is configured to exchange data with the first memory block chip 100 and the second memory block chip 100*a* through the through-chip via (TSV). The voltage generating chip 600 is configured to provide a plurality of internal voltages to the stacked chips through the through-chip via (TSV). Each of the chips may include a pad (PAD), and may exchange signals with an external device through a wire connected to the pad (PAD).

According to a third exemplary embodiment 3, the semiconductor apparatus may include a plurality of stacked chips comprising a first memory block chip 100, a second memory block chip 100*a*, a third memory block chip 100*b*, a fourth memory block chip 100*c*, a voltage generating chip 600, a signal input/output chip 400, and a main control chip 500.

In this disclosed embodiment, the main control chip 500 is configured to transmit a control signal through a through-chip via (TSV) to control an operation of the first memory block chip 100, an operation of the second memory block chip 100*a*, an operation of the third memory block chip 100*b*, and an operation of the fourth memory block chip 100*c*. The signal input/output chip 400 is configured to exchange data with the first memory block chip 100, the second memory block chip 100*a*, the third memory block chip 100*b*, and the fourth memory block chip 100*c* through the through-chip via (TSV). The voltage generating chip 600 is configured to provide a plurality of internal voltages to the stacked chips through the through-chip via (TSV). Each of the chips includes a pad (PAD), and may exchange signals with an external device through a wire connected to the pad (PAD). These signals are mainly used to perform a test operation.

According to the first to third exemplary embodiments, a plurality of chips, which are independently fabricated according to their respective functions, may be stacked to fabricate a semiconductor apparatus. Unlike the disclosed exemplary embodiments, it may be possible to stack only the necessary chips to fabricate a semiconductor apparatus.

Each of the chips stacked in a semiconductor apparatus fabricated consistent with the present invention will be described below in more detail.

The memory block chip 100, 100*a*, 100*b*, 100*c* is configured to control a data access size according to specifications. For example, the memory block chip 100, 100*a*, 100*b*, 100*c* may control the data access size according to an information set in a mode register set.

The signal input/output chip 400 is configured to transmit input data from an external device to the memory block chip 100 or transmit output data from the memory block chip 100 to an external device. The signal input/output chip 400 is configured to process the input data or the output data by enabling a clock phase control unit and a signal processing unit selectively according to the specifications.

The clock phase control unit may include one or more of a phase-locked loop (PLL) and a delay-locked loop (DLL), and any one of them may be enabled according to a setting value of a mode register set (MRS) of the main control chip 500.

The signal processing unit is configured to perform one or more of an error correction code (ECC) function, a data bus inversion (DBI) function, and an address bus inversion (ABI) function.

If a plurality of signals outputted through the pad (PAD) in the semiconductor apparatus change simultaneously (e.g., signals changing from a high level to a low level or from a low level to a high level), the power consumption increases and a noise occurs. Thus, a data bus inversion (DBI) technique may be used to reduce the number of data changes, and an address bus inversion (ABI) technique may be used to reduce the number of address changes.

The signal input/output chip 400 is configured to control a data width of a data transmission path according to the specifications. For example, the signal input/output chip 400 may be configured to control a data width of the data transmission path according to a data access information set in the mode register set. Also, the signal input/output chip 400 may be configured to control a bit organization of the output data according to information set in the mode register set.

The main control chip 500 may be configured to decode an address and a command and selectively enable a register for setting a function corresponding to each of the specifications. The registers of the main control chip 500 may be classified into a general mode register set (MRS) and a register for setting a desired function.

The voltage generating chip 600 is configured to generate a plurality of internal voltages by a power supply voltage and provide the generated internal voltages to the stacked chips. The voltage generating chip 600 is configured to control a voltage level of the internal voltages according to the specifications.

The specifications may be classified into dynamic random access memory (DRAM), synchronous dynamic random access memory (SDRAM), and double data rate (DDR) SDRAM, and may be classified into computing random access memory (RAM), graphics RAM, and mobile RAM.

The semiconductor apparatus of the exemplary embodiments is configured to control a register and a setup fuse according to the specifications to perform an operation corresponding to each specification. For example, each of the chips stacked in the semiconductor apparatus may selectively enable a function corresponding to each specification according to the cutting state of a general setup fuse or the information set in the mode register set (MRS) of the main control chip 500.

Since the chips may be separately tested before the stacking, each of the chips may include a test unit configured to test an internal circuit by a test code received through the pad (PAD).

As described above, a semiconductor apparatus may include a stack of a memory block chip, a signal input/output chip, a main control chip, and a voltage generating chip that are fabricated independently of each other. Here, each chip can control a function selectively according to the specifications. Therefore, even if the specifications are changed, each chip can be controlled to perform an operation corresponding to each specification by changing the setting information of the mode register set (MRS). Accordingly, it is possible to reduce the development time and cost of semiconductor apparatuses.

Figure 2:
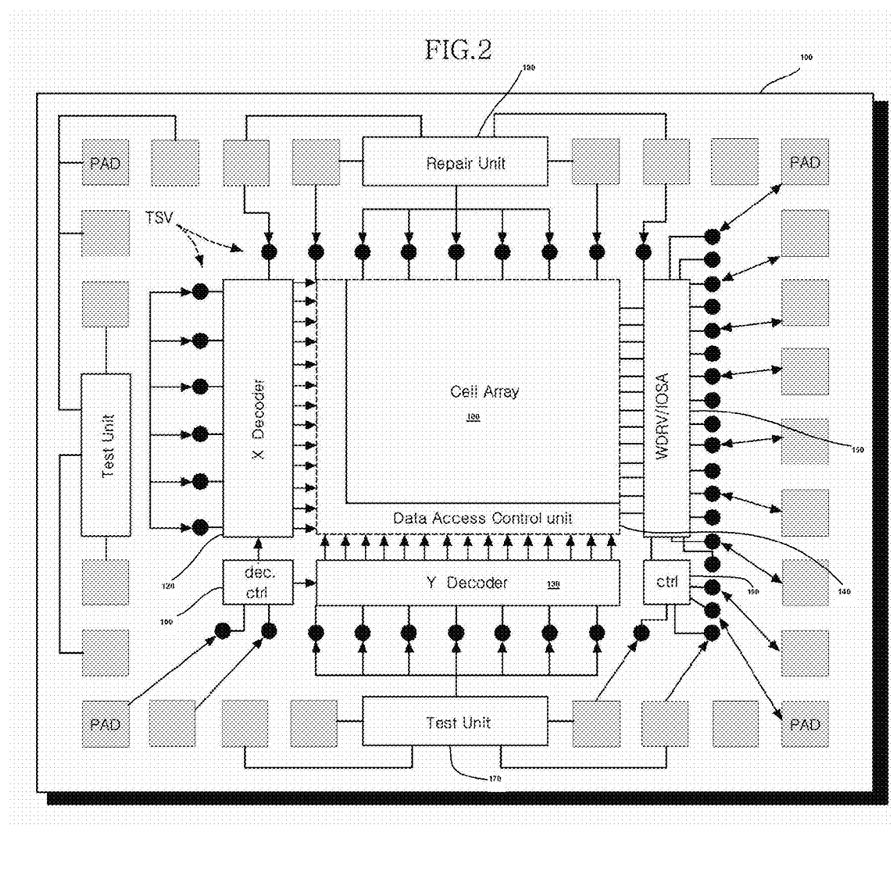
FIG. 2 is a block diagram of an exemplary embodiment of a memory block chip illustrated in FIG. 1.

FIG. 2 is a block diagram of an exemplary embodiment of the memory block chip illustrated in FIG. 1.

Referring to FIG. 2, the memory block chip 100 may include a memory cell array 110, a row address decoder 120, a column address decoder 130, a data access control unit 160, and a data input/output driver 150 (WDRV/IOSA). The memory block chip 100 may further include one or more test units 170 and a repair unit 180.

The cell array 110 may include a plurality of memory cells. The memory cells may be arranged two-dimensionally and may be divided into a row region and a column region.

The row address decoder 120 is configured to decode a row address to selectively activate a plurality of row selection signals for controlling a data access to a row region of the memory array 110. The row address decoder 120 controls the number of simultaneously-activated row selection signals according to a row access information set in the mode register set. In an exemplary embodiment, the row selection signals are defined as signals outputted from the row address decoder 120.

The column address decoder 130 is configured to decode a column address to selectively activate a plurality of column selection signals for controlling a data access to a column region of the memory array 110. The column address decoder 130 controls the number of simultaneously-activated column selection signals according to a column access information set in the mode register set. In an exemplary embodiment, the column selection signals are defined as signals outputted from the column address decoder 130.

The row/column address decoders 120, 130 are configured to control the number of simultaneously-activated row/column selection signals under the control of a decoder control unit 160. The decoder control unit 160 controls the number of simultaneously-activated row/column selection signals according to an information set in the mode register set.

The data access control unit is configured to selectively transmit the row selection signals and the column selection signals to the memory array 110 according to a data access information set in the mode register set. Here, the data access control unit may be configured to connect a data transmission path and selected memory cells, and control a data width of the data transmission path according to the data access information set.

The data input/output driver 150 is configured to amplify a signal received from the data transmission path to output the amplified signal as the output data, or transmit the input data to the data transmission path. The data input/output driver 150 perform a data input/output operation under the control of an input/output control unit 190.

The test unit 170 is configured to control the row address decoder 120, the column address decoder 130, the data access control unit 140, and the data input/output driver 150 according to a test code received through the pad (PAD).

The repair unit 180 is configured to repair one or more defective memory cells of the memory array 110.

Figure 3:
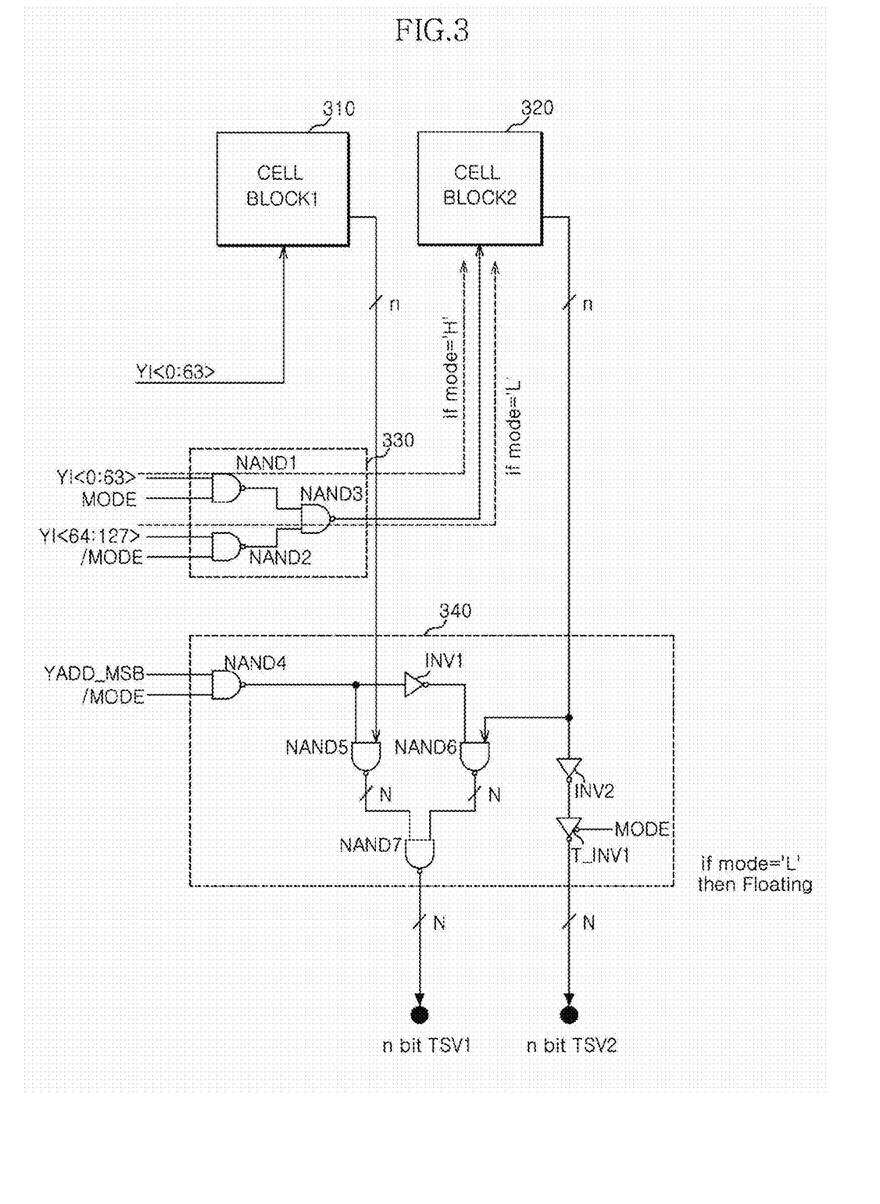
FIG. 3 is a circuit diagram of an exemplary embodiment of a data access control unit illustrated in FIG. 2.

FIG. 3 is a circuit diagram of an exemplary embodiment of the data access control unit illustrated in FIG. 2. The data access control unit of FIG. 3 selectively transmits a plurality of column selection signals to the memory array 110.

In one exemplary embodiment, the data access control unit 140 is configured to control the data width of the data transmission path according to the data access information when connecting the data transmission path and the selected memory cells. That is, the data access control unit of FIG. 3 is configured to control the data width and the data access size for the column region. The same circuit may be used to control the data width and the data access size for the row region. The data access size of the row region may also be defined as the size of a page that can be simultaneously accessed.

As shown in FIG. 3, the data access control unit may include a selection signal control unit 330 and a data path control unit 340. When a mode selection signal (mode) is at a low level, the selection signal control unit 330 transmits a plurality of first column selection signals YI<0:63> to a first cell block 310 and transmits a plurality of second column selection signals YI<64:127> to a second cell block 320. Here, a plurality of first data signals of the first cell block 310 selected by the first column selection signals YI<0:63> are transmitted to the data path control unit 340. Also, a plurality of second data signals of the second cell block 320 selected by the second column selection signals YI<64:127> are transmitted to the data path control unit 340.

When the mode selection signal (mode) is at a high level, the selection signal control unit 330 simultaneously transmits the first column selection signals YI<0:63> to both the first cell block 310 and the second cell block 320. Here, a plurality of first data signals of the first cell block 310 selected by the first column selection signals YI<0:63> are transmitted to the data path control unit 340. Also, a plurality of second data signals of the second cell block 320 selected by the first column selection signals YI<0:63> are transmitted to the data path control unit 340. That is, the number of necessary column selection signals decreases by half.

When the mode selection signal (mode) is at a low level, and a path control signal (YADD_MSB) is at a low level, the data path control unit 340 transmits a plurality of first data signals to a plurality of first through-chip vias (n-bit TSV1). On the other hand, if the path control signal (YADD_MSB) is at a high level, the data path control unit 340 transmits a plurality of second data signals to a plurality of second through-chip vias (n-bit TSV2).

When the mode selection signal (mode) is at a high level, the data path control unit 340 transmits a plurality of first data signals to a plurality of first through-chip vias (n-bit TSV1) and transmits a plurality of second data signals to a plurality of second through-chip vias (n-bit TSV2), regardless of the level of the path control signal (YADD_MSB). That is, the data width increases by 2.

In some exemplary embodiments, the selection signal control unit 330 may include a plurality of NAND gates NAND1, NAND2 and NAND3. Also, the data path control unit 340 may include a plurality of NAND gates NAND4, NAND5, NAND6 and NAND7, a plurality of inverters INV1 and INV2, and a 3-phase inverter T_INV1.

Figure 4:
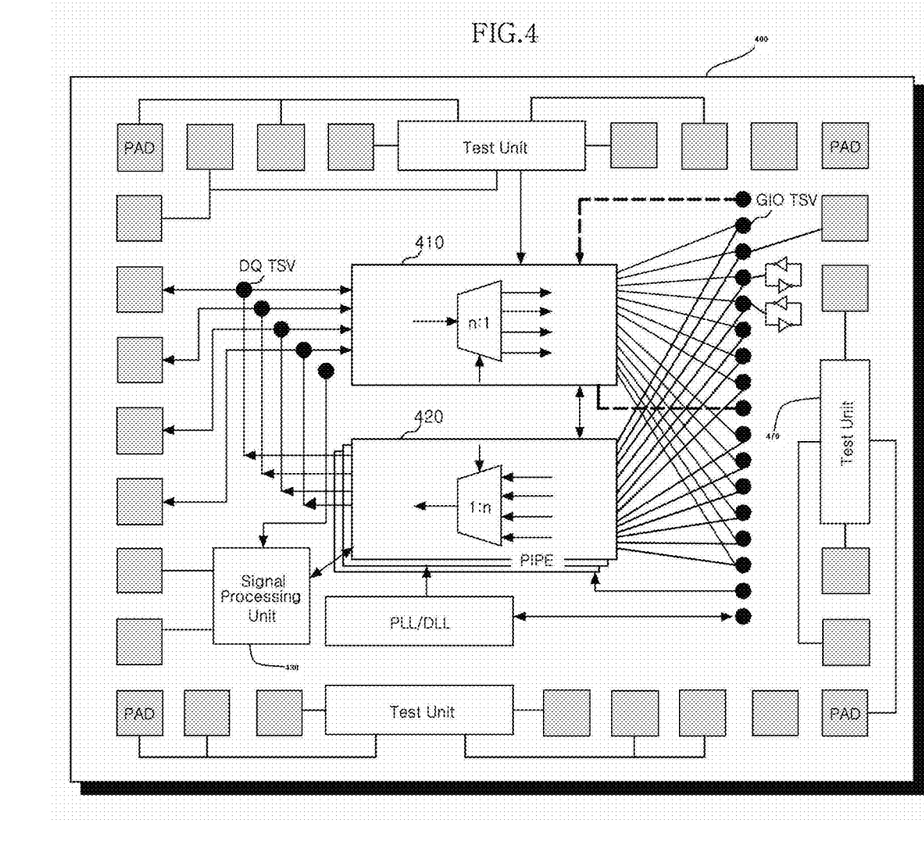
FIG. 4 is a block diagram of an exemplary embodiment of a signal input/output chip illustrated in FIG. 1.

FIG. 4 is a block diagram of an exemplary embodiment of the signal input/output chip illustrated in FIG. 1. As shown in FIG. 4, the signal input/output chip 400 may include an input data processing unit 410, an output data processing unit 420, a signal processing unit 430, a clock phase control unit, and a test unit 470.

The signal input/output chip 400 is configured to transmit the input data from the external device to the memory block chip 100 through an internal transmission line (GIO TSV) or transmit the output data from the memory block chip 100 to an external device through the internal transmission line (GIO TSV). The signal input/output chip 400 may be configured to process the input data or the output data by enabling a clock phase control unit and a signal processing unit selectively according to the specifications.

The clock phase control unit may include at least one of a phase-locked loop (PLL) and a delay-locked loop (DLL). Any one of them may be enabled according to a setting value of a mode register set (MRS) of the main control chip 500.

The signal processing unit may be configured to perform one or more of an error correction code (ECC) function, a data bus inversion (DBI) function, and an address bus inversion (ABI) function.

The input data processing unit 410 is configured to parallelize the input data and transmit the resulting parallel data to the transmission line (GIO TSV). Also, the output data processing unit 420 is configured to serialize the output data and output the resulting serial data to the external device. The input data processing unit 410 and the output data processing unit 420 may control the number of necessary internal transmission lines (GIO) and external transmission lines (DQ) according to an information set in the mode register set. That is, the data width of the transmission path may be controlled according to the data access information set in the mode register set.

Also, the input data processing unit 410 and the output data processing unit 420 may control a bit organization of the output data according to an information set in the mode register set. The number of bits of simultaneously-outputted data can be determined according to how the bit organization is set. The semiconductor apparatus is designed to flexibly select various bit organizations such as X4, X8, and X16.

The test unit may be configured to control the input data processing unit 410, the output data processing unit 420, the signal processing unit, and the clock phase control unit according to the test code received through the pad (PAD).

Figure 5:
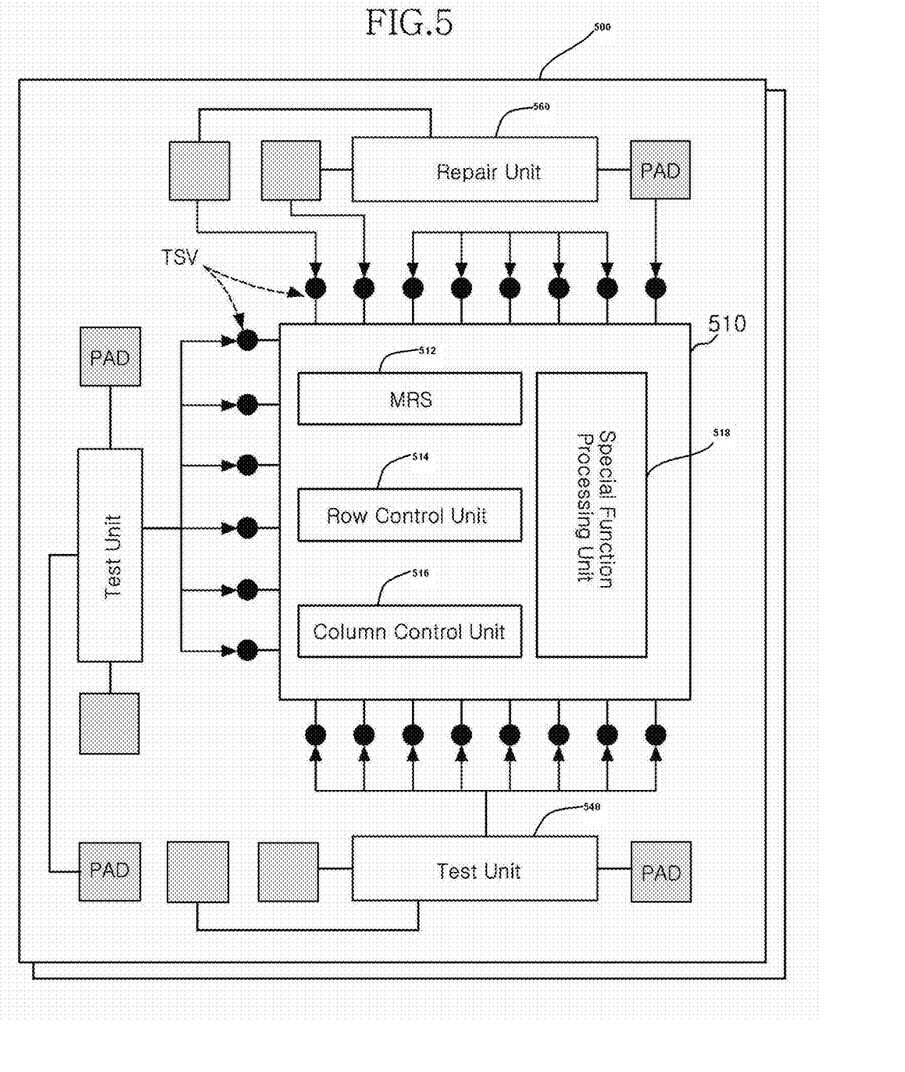
FIG. 5 is a block diagram of an exemplary embodiment of a main control chip illustrated in FIG. 1.

FIG. 5 is a block diagram of an exemplary embodiment of the main control chip illustrated in FIG. 1. Referring to FIG. 5, the main control chip 500 may include a command-related processing circuit and an address-related processing circuit. For example, the main control chip 500 may include a command/address processing unit 510. The main control chip 500 may further include a test unit and a repair unit.

In one exemplary embodiment, the command/address processing unit 510 may include a mode register set 512, a row control unit 514, a column control unit 516, and a special function processing unit 518.

The mode register set 512 may be configured to store internal setting information, row access information, column access information, and data access information. Such information may be controlled according to desired specifications to control a data access size and a prescribed timing required by each specifications.

The row control unit 514 and the column control unit 516 are configured to decode an address and a command and generate a row region-related control signal and a column region-related control signal.

The special function processing unit 518 may include a plurality of registers configured to set functions corresponding to the specifications. The registers can be selectively enabled according to the corresponding specifications.

The test unit 540 may be configured to control the command/address processing unit 510 according to the test code received through the pad (PAD).

The repair unit 560 may include a setup fuse and may be configured to store repair information and chip identification.

Figure 6:
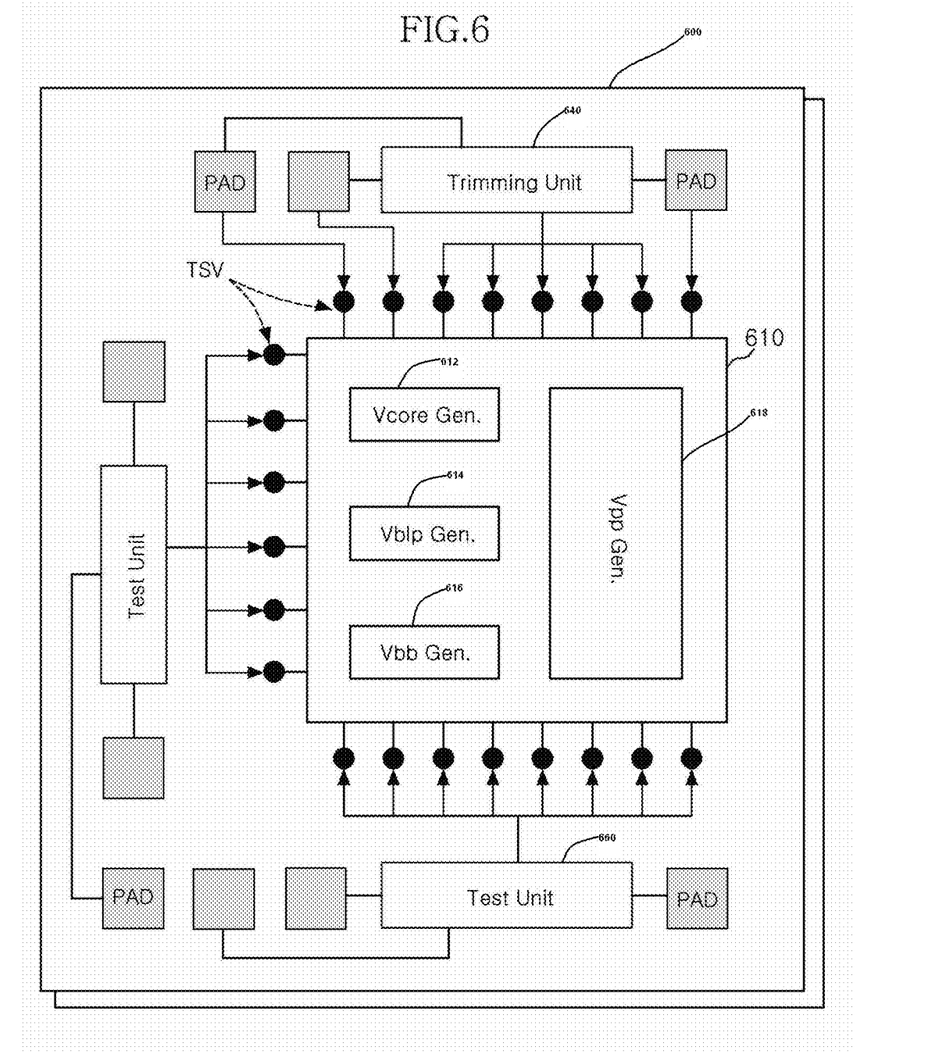
FIG. 6 is a block diagram of an exemplary embodiment of a voltage generating chip illustrated in FIG. 1.

FIG. 6 is a block diagram of an exemplary embodiment of the voltage generating chip illustrated in FIG. 1. The voltage generating chip 600 may be configured to generate a plurality of internal voltages by a power supply voltage and provide the generated internal voltages to the stacked chips. Here, the voltage generating chip 600 may be configured to control a voltage level of the internal voltages according to the specifications. For example, the voltage level of the internal voltages may be controlled according to an information set in the mode register set.

As shown in FIG. 6, the voltage generating chip 600 may include a plurality of internal voltage generating units 610, a trimming unit 640, and a test unit 660.

The internal voltage generating units 610 may include one or more first internal voltage generating units 612, 614, 616 configured to divide a power supply voltage to output a division voltage, and one or more second internal voltage generating units 616, 618 configured to pump the power supply voltage to output a negative/positive boost voltage. The internal voltage generating units 610 may be configured to control the level of a voltage generated according to an information set in the mode register set.

The trimming unit 640 is configured to minutely trim a plurality of internal voltages generated by the internal voltage generating units. The trimming unit 640 may include a fuse or a register configured to store a trimming code.

The test unit 660 may be configured to control the internal voltage generating units 610 according to the test code received through the pad (PAD).

Figure 7:
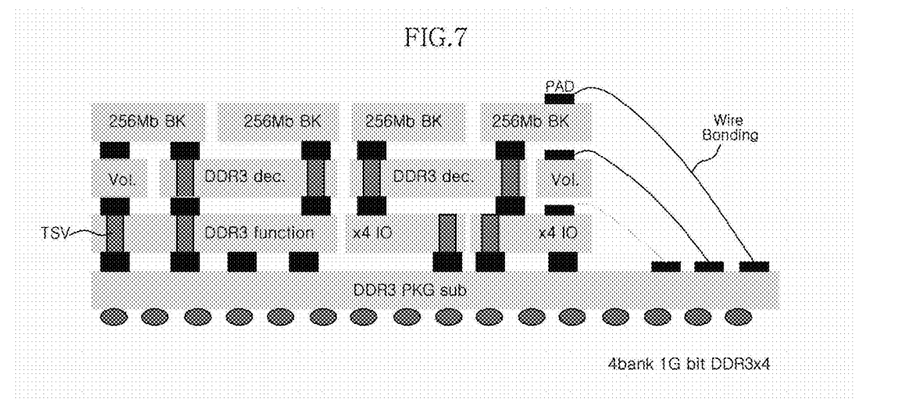
FIG. 7 illustrates a stack structure of a semiconductor apparatus according to another exemplary embodiment consistent with the present invention.

FIG. 7 illustrates a stack structure of a semiconductor apparatus according to another exemplary embodiment consistent with the present invention. The semiconductor apparatus of FIG. 7 includes a stack of four memory block chips (256 Mb BK), two signal input/output chips (X4 IO), a main control chip (DDR3 function), two voltage generating units (Vol.), and a decoder chip (DDR3 dec.). This exemplary semiconductor apparatus controls each of the chips to perform an operation corresponding to 'DDR3 spec'. The decoder chip (DDR3 dec.) may be defined as a chip configured to decode an address or a command.

Figure 8:
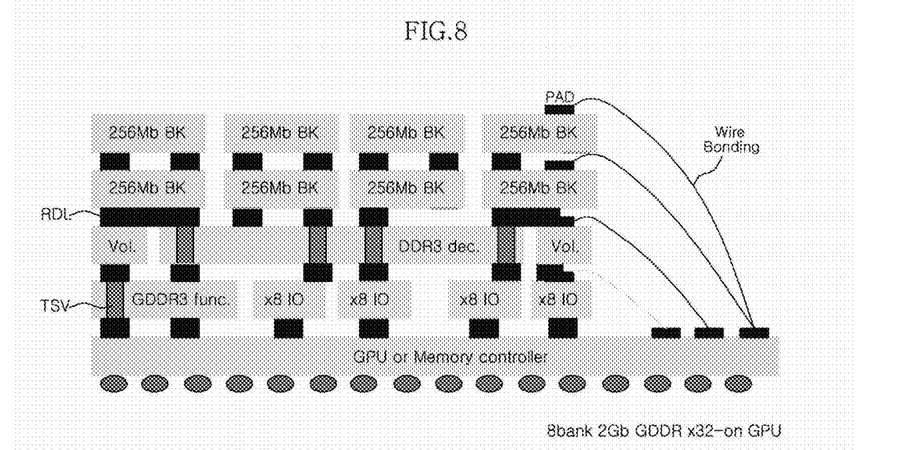
FIG. 8 illustrates a stack structure of a semiconductor apparatus according to still another exemplary embodiment consistent with the present invention.

FIG. 8 illustrates a stack structure of a semiconductor apparatus according to another exemplary embodiment consistent with the present invention. The semiconductor apparatus of FIG. 8 includes a stack of eight memory block chips (256 Mb BK), four signal input/output chips (X8 IO), a main control chip (GDDR3 func.), two voltage generating units (Vol.), and a decoder chip (GDDR3 dec.).

This exemplary semiconductor apparatus controls each of the chips to perform an operation corresponding to 'DDR3 spec'. The decoder chip (GDDR3 dec.) may be defined as a chip configured to decode an address or a command.

The stacked chips may transmit and receive signals through a through-chip via (TSV). Also, the stacked chips may transmit and receive signals through a plurality of transmission lines that are formed using a re-distribution layer (RDL). Here, the term "re-distribution layer," as used herein, may refer to an interconnection layer formed between the chips.

As described above, the semiconductor apparatus may include a stack of a memory block chip, a signal input/output chip, a main control chip, and a voltage generating chip that are independently fabricated from one another. Each chip can control a function selectively according to the specifications. Therefore, even in the event of a change in the specifications, each chip can be controlled to perform an operation corresponding to each specification by changing the setting information of the mode register set (MRS). Accordingly, it is possible to reduce the development time and cost of semiconductor apparatuses.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a memory block chip configured to control a data access size according to specifications; and
   a signal input/output chip configured to transmit input data from an external device to the memory block chip or transmit output data from the memory block chip to an external device and process the input data or the output data by selectively enabling a clock phase control unit and a signal processing unit according to the specifications.

2. The semiconductor apparatus according to claim 1, wherein the memory block chip and the signal input/output chip are stacked and are configured to transmit and receive signals therebetween through a through-chip via or a transmission line.

3. The semiconductor apparatus according to claim 1, wherein the clock phase control unit comprises at least one of a phase-locked loop (PLL) and a delay-locked loop (DLL).

4. The semiconductor apparatus according to claim 1, wherein the signal processing unit is configured to perform one or more of an error correction code (ECC) function, a data bus inversion (DBI) function, and an address bus inversion (ABI) function.

5. The semiconductor apparatus according to claim 1, wherein the specifications are classified into dynamic random access memory (DRAM), synchronous dynamic random access memory (SDRAM), and double data rate (DDR) SDRAM.

6. The semiconductor apparatus according to claim 1, wherein the specifications are classified into computing random access memory (RAM), graphics RAM, and mobile RAM.

7. The semiconductor apparatus according to claim 1, wherein the memory block chip comprises:
   a memory array comprising a plurality of memory cells;
   a row address decoder configured to decode a row address to selectively activate a plurality of row selection signals for controlling a data access to a row region of the memory array, and control the number of simultaneously-activated row selection signals according to row access information set in a mode register set;
   a column address decoder configured to decode a column address to selectively activate a plurality of column selection signals for controlling a data access to a column region of the memory array, and control the number of simultaneously-activated column selection signals according to a column access information set in the mode register set;
   a data access control unit configured to selectively transmit the row selection signals and the column selection signals to the memory array according to data access information set in the mode register set, connect a data transmission path and selected memory cells, and control a data width of the data transmission path according to the data access information set; and
   a data input/output driver configured to amplify a signal received from the data transmission path to output the amplified signal as the output data, or transmit the input data to the data transmission path.

8. The semiconductor apparatus according to claim 7, wherein the memory block chip further comprises:
   a test unit configured to control the row address decoder, the column address decoder, and the data input/output driver according to a test code received through a pad; and
   a repair unit configured to repair a defective memory cell of the memory array.

9. The semiconductor apparatus according to claim 1, wherein the signal input/output chip is configured to control a data width of a data transmission path according to the specifications.

10. The semiconductor apparatus according to claim 1, wherein the signal input/output chip is configured to control a bit organization of the output data according to an information set in a mode register set.

11. A semiconductor apparatus comprising:
   a memory block chip configured to control a data access size according to specifications; and
   a main control chip configured to decode an address and a command and selectively enable a register for setting a function corresponding to each of the specifications,
   wherein the memory block chip is configured to control a data access under the control of the main control chip.

12. The semiconductor apparatus according to claim 11, wherein the memory block chip and the main control chip are stacked and are configured to transmit and receive signals therebetween through a through-chip via or a transmission line.

13. The semiconductor apparatus according to claim 11, wherein the specifications are classified into dynamic random access memory (DRAM), synchronous dynamic random access memory (SDRAM), and double data rate (DDR) SDRAM.

14. The semiconductor apparatus according to claim 11, wherein the specifications are classified into computing random access memory (RAM), graphics RAM, and mobile RAM.

15. The semiconductor apparatus according to claim 11, wherein the memory block chip comprises:
a memory array comprising a plurality of memory cells;
a row address decoder configured to decode a row address to selectively activate a plurality of row selection signals for controlling a data access to a row region of the memory array, and control the number of simultaneously-activated row selection signals according to row access information set in a mode register set;
a column address decoder configured to decode a column address to selectively activate a plurality of column selection signals for controlling a data access to a column region of the memory array, and control the number of simultaneously-activated column selection signals according to a column access information set in the mode register set;
a data access control unit configured to selectively transmit the row selection signals and the column selection signals to the memory array according to data access information set in the mode register set, connect a data transmission path and selected memory cells, and control a data width of the data transmission path according to the data access information set; and
a data input/output driver configured to amplify a signal received from the data transmission path to output the amplified signal as the output data, or transmit the input data to the data transmission path.

16. The semiconductor apparatus according to claim 15, wherein the memory block chip further comprises:
a test unit configured to control the row address decoder, the column address decoder, and the data input/output driver according to a test code received through a pad; and
a repair unit configured to repair a defective memory cell of the memory array.

17. A semiconductor apparatus comprising:
a memory block chip configured to control a data access size according to specifications; and
a voltage generating chip configured to generate a plurality of internal voltages by a power supply voltage, provide the generated internal voltages to the memory block chip, and control a voltage level of the internal voltages according to the specifications.

18. The semiconductor apparatus according to claim 17, wherein the memory block chip and the voltage generating chip are stacked and are configured to transmit and receive signals therebetween through a through-chip via or a transmission line.

19. The semiconductor apparatus according to claim 17, wherein the specifications are classified into dynamic random access memory (DRAM), synchronous dynamic random access memory (SDRAM), and double data rate (DDR) SDRAM.

20. The semiconductor apparatus according to claim 17, wherein the specifications are classified into computing random access memory (RAM), graphics RAM, and mobile RAM.

21. The semiconductor apparatus according to claim 17, wherein the memory block chip comprises:
a memory array comprising a plurality of memory cells;
a row address decoder configured to decode a row address to selectively activate a plurality of row selection signals for controlling a data access to a row region of the memory array, and control the number of simultaneously-activated row selection signals according to row access information set in a mode register set;
a column address decoder configured to decode a column address to selectively activate a plurality a column selection signals for controlling a data access to a column region of the memory array, and control the number of simultaneously-activated column selection signals according to a column access information set in the mode register set;
a data access control unit configured to selectively transmit the row selection signals and the column selection signals to the memory array according to data access information set in the mode register set, connect a data transmission path and selected memory cells, and control a data width of the data transmission path according to the data access information set; and
a data input/output driver configured to amplify a signal received from the data transmission path to output the amplified signal as the output data, or transmit the input data to the data transmission path.

22. The semiconductor apparatus according to claim 21, wherein the memory block chip further comprises:
a test unit configured to control the row address decoder, the column address decoder, and the data input/output driver according to a test code received through a pad; and
a repair unit configured to repair a defective memory cell of the memory array.

23. A semiconductor apparatus, which includes a plurality of through-chip vias piercing between a plurality of stacked chips and transmits signals and voltages between the stacked chips through the through-chip vias or a plurality of transmission lines, the semiconductor apparatus comprising:
a memory block chip configured to control a data access size according to specifications;
a signal input/output chip configured to transmit input data from an external device to the memory block chip or transmit output data from the memory block chip to an external device and process the input data or the output data by selectively enabling a clock phase control unit and a signal processing unit according to the specifications;
a main control chip configured to decode an address and a command and selectively enable a register for setting a function corresponding to each of the specifications; and
a voltage generating chip configured to generate a plurality of internal voltages by a power supply voltage, provide the generated internal voltages to the stacked chips, and control a voltage level of the internal voltages according to the specifications,
wherein the main control chip controls the memory block chip, the signal input/output chip, and the voltage generating chip.

24. The semiconductor apparatus according to claim 23, wherein the memory block chip, the signal input/output chip, the main control chip, and the voltage generating chip are stacked and configured to transmit and receive signals through the through-chip vias or the transmission lines.

25. The semiconductor apparatus according to claim 23, wherein the specifications are classified into dynamic random access memory (DRAM), synchronous dynamic random access memory (SDRAM), and double data rate (DDR) SDRAM.

26. The semiconductor apparatus according to claim 23, wherein the specifications are classified into computing random access memory (RAM), graphics RAM, and mobile RAM.

27. The semiconductor apparatus according to claim 23, wherein the signal processing unit is configured to perform one or more of an error correction code (ECC) function, a data bus inversion (DBI) function, and an address bus inversion (ABI) function.

28. The semiconductor apparatus according to claim 23, wherein the clock phase control unit comprises at least one of a phase-locked loop (PLL) and a delay-locked loop (DLL).

29. The semiconductor apparatus according to claim 23, wherein the memory block chip comprises:
  a memory array comprising a plurality of memory cells;
  a row address decoder configured to decode a row address to selectively activate a plurality of row selection signals for controlling a data access to a row region of the memory array, and control the number of simultaneously-activated row selection signals according to a row access information set in a mode register set;
  a column address decoder configured to decode a column address to selectively activate a plurality of column selection signals for controlling a data access to a column region of the memory array, and control the number of simultaneously-activated column selection signals according to a column access information set in the mode register set;
  a data access control unit configured to selectively transmit the row selection signals and the column selection signals to the memory array according to a data access information set in the mode register set, connect a data transmission path and selected memory cells, and control a data width of the data transmission path according to the data access information set; and
  a data input/output driver configured to amplify a signal received from the data transmission path to output the amplified signal as the output data, or transmit the input data to the data transmission path.

30. The semiconductor apparatus according to claim 29, wherein the memory block chip further comprises:
  a test unit configured to control the row address decoder, the column address decoder, and the data input/output driver according to a test code received through a pad; and
  a repair unit configured to repair a defective memory cell of the memory array.

31. The semiconductor apparatus according to claim 23, wherein each of the stacked chips comprises a test unit configured to test an internal circuit by a test code received through a pad.

32. The semiconductor apparatus according to claim 23, wherein the signal input/output chip is configured to control a data width of a data transmission path according to the specifications.

33. The semiconductor apparatus according to claim 23, wherein the signal input/output chip is configured to control a bit organization of the output data according to an information set in a mode register set.

* * * * *